United States Patent [19]
Lee et al.

[11] Patent Number: 5,989,980
[45] Date of Patent: *Nov. 23, 1999

[54] SEMICONDUCTOR PROCESSING METHOD OF FORMING FIELD ISOLATION OXIDE RELATIVE TO A SEMICONDUCTOR SUBSTRATE

[75] Inventors: Roger R. Lee; Fernando Gonzalez, both of Boise, Id.

[73] Assignee: Micron Technology, Inc., Boise, Id.

[ * ] Notice: This patent is subject to a terminal disclaimer.

[21] Appl. No.: 08/978,430

[22] Filed: Nov. 25, 1997

Related U.S. Application Data

[63] Continuation of application No. 08/699,551, Aug. 19, 1996, Pat. No. 5,714,414.

[51] Int. Cl.⁶ .................................................. H01L 21/762
[52] U.S. Cl. ............................................................... 438/452
[58] Field of Search .......................... 438/452, FOR 229, 438/FOR 230; 148/DIG. 85, DIG. 86

[56] References Cited

U.S. PATENT DOCUMENTS

| | | |
|---|---|---|
| 4,520,553 | 6/1985 | Kraft . |
| 4,743,566 | 5/1988 | Bastiaens et al. . |
| 4,758,530 | 7/1988 | Schubert . |
| 5,128,274 | 7/1992 | Yabu et al. . |
| 5,145,802 | 9/1992 | Tyson et al. . |
| 5,372,951 | 12/1994 | Anjum et al. . |
| 5,374,586 | 12/1994 | Huang et al. . |
| 5,468,675 | 11/1995 | Kaigawa . |
| 5,580,816 | 12/1996 | Hemmenway et al. . |
| 5,679,600 | 10/1997 | Juengling . |

FOREIGN PATENT DOCUMENTS

| | | |
|---|---|---|
| 53-148389 | 12/1978 | Japan . |
| 1-161848 | 6/1989 | Japan . |
| 2-219253 | 8/1990 | Japan . |
| 2-260639 | 10/1990 | Japan . |
| 4-130630 | 5/1992 | Japan . |
| 4-162528 | 6/1992 | Japan . |
| 4-321228 | 11/1992 | Japan . |

*Primary Examiner*—George Fourson
*Attorney, Agent, or Firm*—Well, St. John, Roberts, Gregory & Matkin P.S.

[57] ABSTRACT

A semiconductor processing method of forming field isolation oxide relative to a semiconductor substrate includes providing a semiconductor substrate having field and active area regions; forming masking material over the active area region and leaving the field region exposed, the masking material comprising first, second and third layers, and having a sidewall; exposing the semiconductor substrate to first oxidation conditions effective to form field isolation oxide of a first thickness over the exposed field region; forming an etch stop material layer over the sidewall; removing at least a portion of the third layer selectively relative to the etch stop material layer; and subjecting the semiconductor substrate to second oxidation conditions effective to grow the field isolation oxide to a second thickness on the exposed field region of the semiconductor substrate.

1 Claim, 3 Drawing Sheets

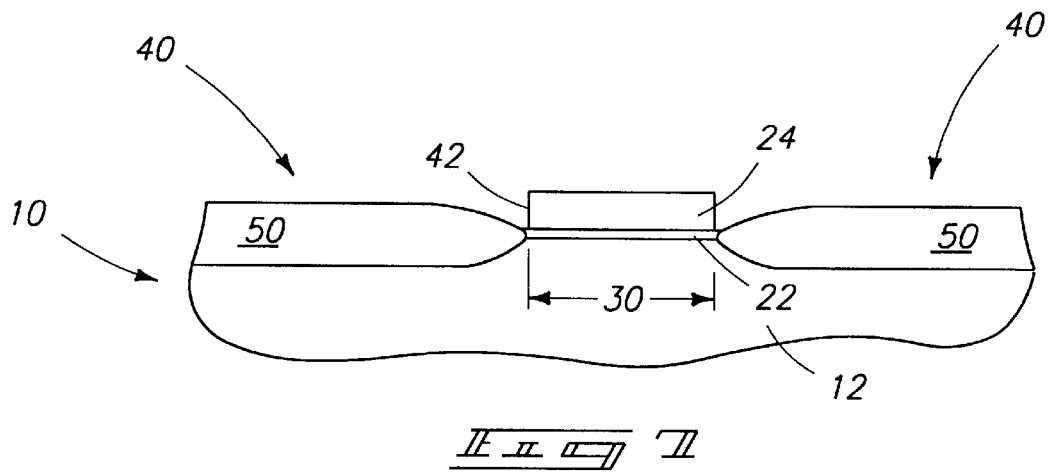
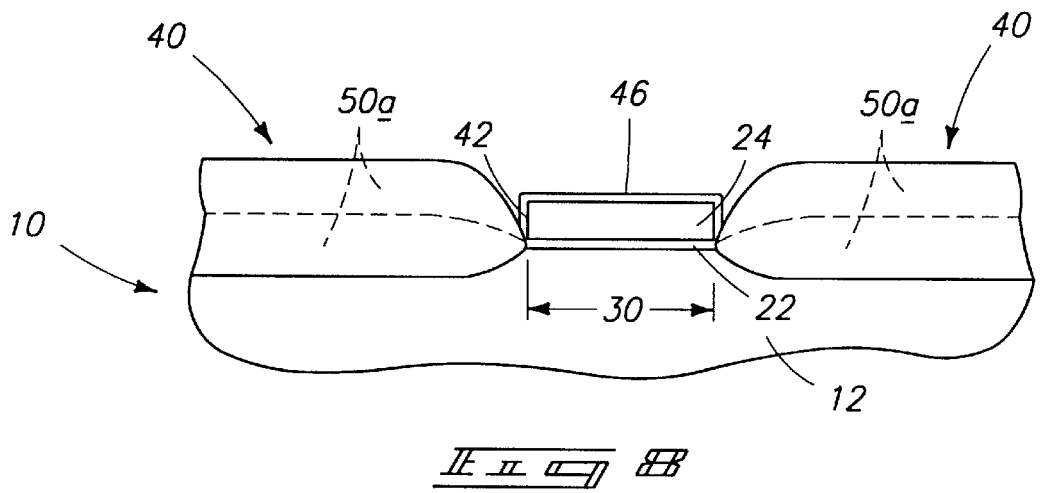
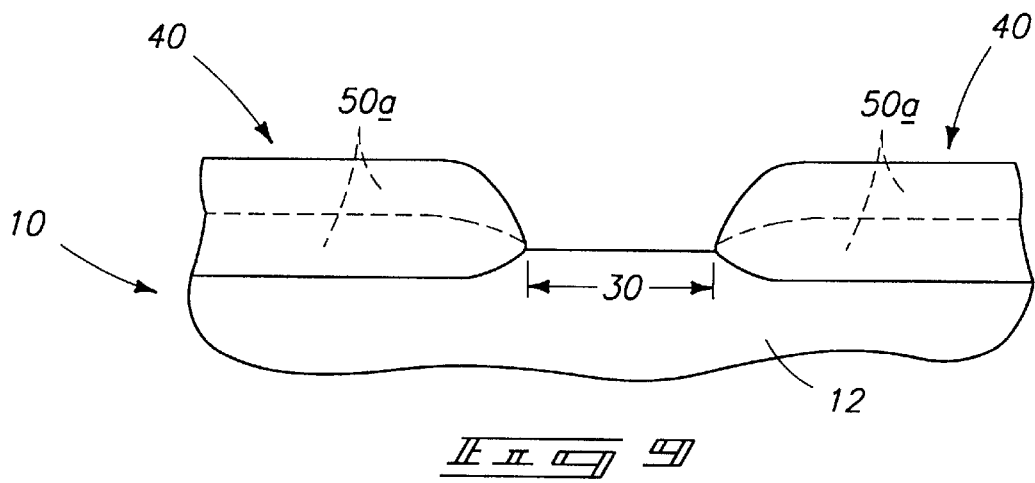

SEMICONDUCTOR PROCESSING METHOD OF FORMING FIELD ISOLATION OXIDE RELATIVE TO A SEMICONDUCTOR SUBSTRATE

RELATED PATENT DATA

This is a continuation application which claims priority from application Ser. No. 08/699,551, filed Aug. 19, 1996, now U.S. Pat. No. 5,714,414, entitled "Semiconductor Processing Method of Forming Field Isolation Oxide Relative to a Semiconductor Substrate".

TECHNICAL FIELD

This invention relates to semiconductor processing methods of forming field isolation oxide relative to a semiconductor substrate.

BACKGROUND OF THE INVENTION

The reduction in memory cell and other circuit size required for high density dynamic random access memories (DRAMs) and other circuitry is a continuing goal in semiconductor fabrication. Implementing electric circuits involves connecting isolated devices through specific electric paths. When fabricating silicon and other material into integrated circuits, it is necessary to isolate devices built into the substrate from one another. Electrical isolation of devices as circuit density increases is a continuing challenge.

One method of isolating devices involves the formation of a semi-recessed or fully recessed oxide in the nonactive (or field) area of the substrate. These regions are typically termed as "field oxide" and are formed by LOCal Oxidation of exposed Silicon, commonly known as LOCOS. One approach in forming such oxide is to cover the active regions with a layer of silicon nitride that prevents oxidation from occurring therebeneath. A thin intervening layer of a sacrificial pad oxide is provided intermediate the silicon substrate and nitride layer to alleviate stress and protect the substrate from damage during subsequent removal of the nitride layer. The unmasked or exposed field regions of the substrate are then subjected to a wet $H_2O$ oxidation, typically at atmospheric pressure and at temperatures of around 1000° C., for two to four hours. This results in field oxide growth where there is no masking nitride.

However at the edges of the nitride, some oxidant also diffuses laterally. This causes the oxide to grow under and lift the nitride edges. Because the shape of the oxide at the nitride edges is that of a slowly tapering oxide wedge that merges into another previously formed layer of oxide, it has commonly been referred to as a "bird's beak". The bird's beak is a lateral extension or encroachment of the field oxide into the active areas where the devices are formed. Although the length of the bird's beak depends upon a number of parameters, the length is typically 0.15 microns to about 0.5 microns per side.

This thinner area of oxide resulting from the bird's beak provides the disadvantage of not providing effective isolation in these regions, and as well unnecessarily consumes precious real estate on the semiconductor wafer. Further, as circuit density commonly referred to as device pitch falls below 0.7 microns, conventional LOCOS techniques fail due to excessive encroachment of the oxide beneath the masking stack. The closeness of the masking block stacks in such instances can result in effective joining of adjacent bird's beaks, thus effectively lifting the masking stacks and resulting in no masking effect to the oxidation.

Also, considerable undesirable stresses are created beneath the nitride at the silicon interface when oxidation occurs. These stresses are in large part due to the formed $SiO_2$ consuming 2.4 times the volume as elemental silicon it replaces. The pad oxide layer absorbs some of this stress, but additional techniques have been utilized. One such technique used to further alleviate the stress during LOCOS is to use a thin layer of polysilicon which is positioned between the pad oxide layer and the overlying nitride. The goal is to have some of the stress, which would otherwise be subjected upon the silicon substrate, occur in the deposited polysilicon layer. A significant problem, however, is that the polysilicon at the edges of the nitride mask will itself oxidize, forming $SiO_2$ which is the same composition as the field oxide regions. Such oxidized polysilicon regions are not practically removable, and undesirably result in increased volume of oxide in the bird's beak regions.

The SILO (sealed-interface local oxidation) process is another modification of typical prior art LOCOS processes. In SILO, a thin layer of silicon nitride is formed on the silicon surface. A pad oxide layer ($SiO_2$) and a nitride film are subsequently deposited. This three layer composite is then photopatterned and etched to overlie desired active area regions and leave predetermined field oxide regions exposed. The nitride layer is intended to seal an interface between it and the silicon substrate surface to restrict lateral diffusion of oxidants during LOCOS, and thus reduce the bird's beak encroachment.

It would be desirable to develop alternate techniques to those described above.

BRIEF DESCRIPTION OF THE DRAWINGS

Preferred embodiments of the invention are described below with reference to the following accompanying drawings.

FIG. 7 is a view of the FIG. 1 wafer fragment shown at a processing step subsequent to that shown in FIG. 6.

FIG. 8 is a view of the FIG. 1 wafer fragment at a processing step subsequent to that shown by FIG. 7.

FIG. 9 is a view of the FIG. 1 wafer fragment at a processing step subsequent to that shown by FIG. 8.

SUMMARY OF THE INVENTION

The present invention relates to the formation of a desired thickness of field isolation oxide on a semiconductor substrate by conducting at least two separate oxidizing steps to achieve the desired thickness.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
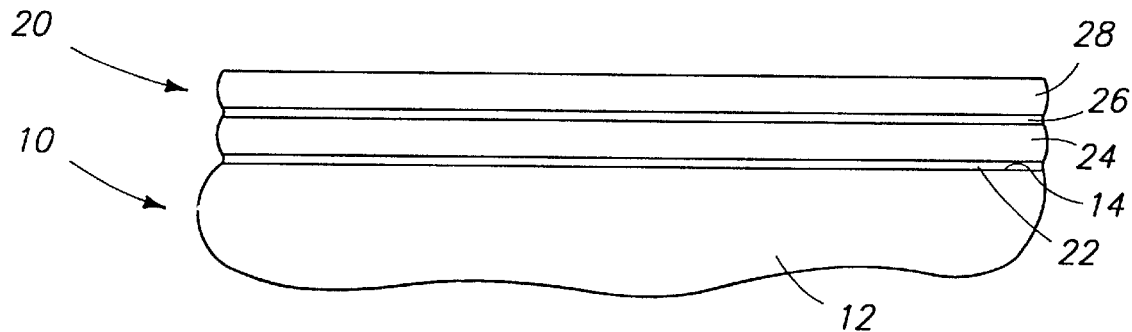
FIG. 1 is a diagrammatic sectional view of a semiconductor wafer fragment at one processing step in accordance with the present invention.

FIG. 1 illustrates a semiconductor wafer fragment in process generally with the numeral 10 in a method of forming field isolation oxide relative thereto. Substrate 10 is preferably comprised of a bulk monocrystalline silicon substrate 12 which includes an outer, exposed surface 14.

Formed over outer exposed surface 14 of the monocrystalline substrate 12 is a masking material layer 20. The masking material 20 comprises a pad oxide layer 22 which is formed over the outer exposed surface 14, and which has a thickness of about 50 Angstroms to about 250 Angstroms. Formed over the pad oxide layer 22 is a first layer of silicon nitride 24 having a thickness of about 500 Angstroms to about 1500 Angstroms. A second layer 26 having a thickness of about 150 Angstroms to about 250 Angstroms is formed over the first layer of silicon nitride 24. The second layer 26 comprises oxide, polysilicon, or any other material which is selectively removable relative to the first layer of silicon nitride, and the silicon nitride being selectively removable relative to it. A third layer of silicon nitride 28 is formed over the second layer 26. The third layer of silicon nitride 28 has a thickness of about 750 to about 1500 Angstroms.

Figure 2:
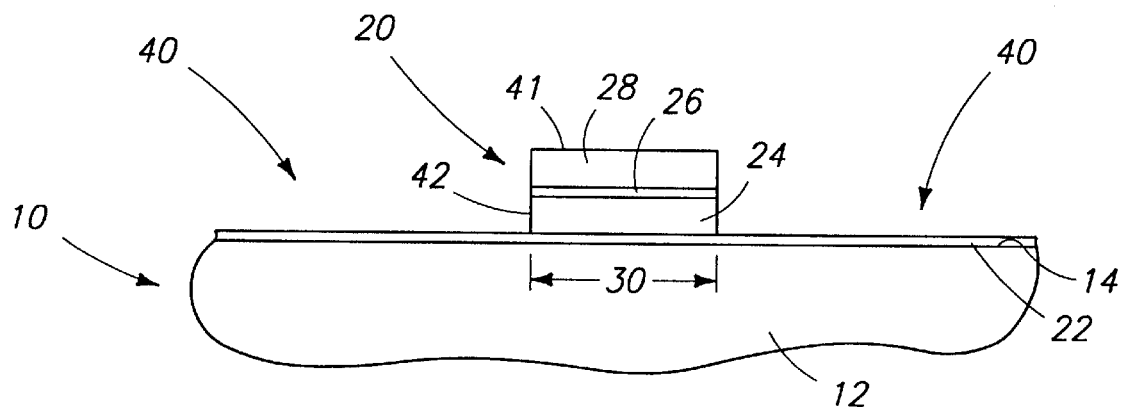
FIG. 2 is a view of the FIG. 1 wafer fragment at a processing step subsequent to that shown by FIG. 1.

Referring now to FIG. 2, the wafer fragment 10 in process is shown following the patterning and removal of a portion of the masking material 20. The removal of the masking material portion defines a masked active area region or first portion 30 of the substrate; and an unmasked second portion, or field region 40. The masking material 20 has an exposed surface 41, and sidewalls 42.

Figure 3:
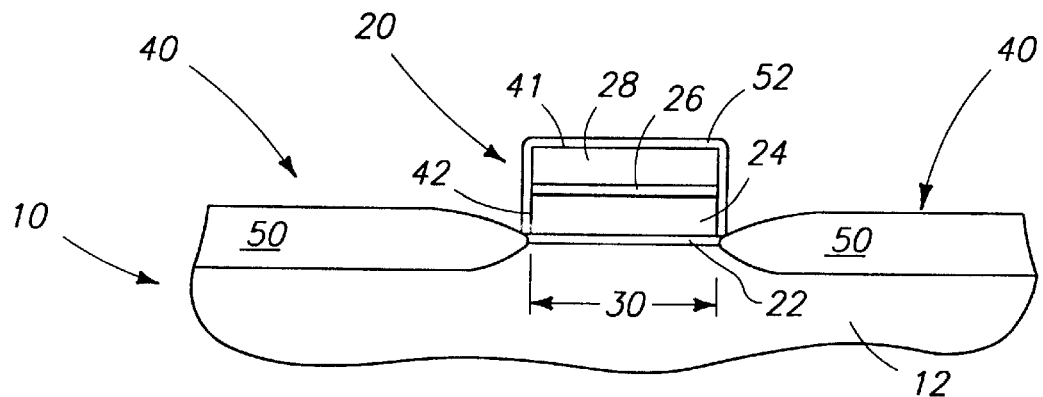
FIG. 3 is a view of the FIG. 1 wafer fragment at a processing step subsequent to that shown by FIG. 2.

Referring now to FIG. 3, the semiconductor substrate in process 10 is shown following its exposure to oxidation conditions, such as in a LOCOS process which is effective to form field isolation oxide 50, of a given thickness on the second portion or field region 40 of the substrate 12. Further, exposing the substrate 12 to the first oxidation conditions is effective to form a layer of masking oxide 52 on the exposed surface 41 and sidewalls 42 of the composite layer 20. The layer of masking oxide 52 has a thickness of less than about 50 Angstroms. Under conditions where the masking oxide layer 52 can be grown to a thickness of about 50 to about 150 Angstroms, a subsequent processing step can be eliminated. This will be discussed hereinafter. The first oxidation conditions are effective to grow approximately 30% to about 60% of the desired resultant field oxide thickness.

Figure 4:
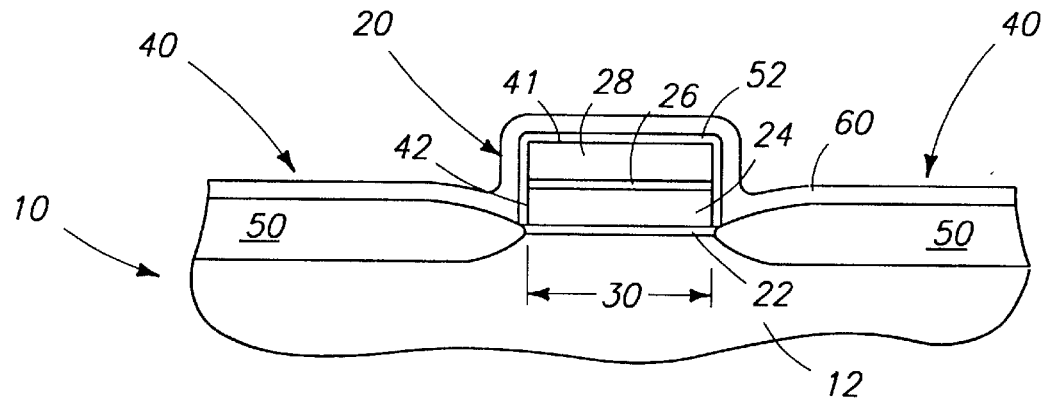
FIG. 4 is a view of the FIG. 1 wafer fragment at a processing step subsequent to that shown in FIG. 3.

Referring now to FIG. 4, a thin layer of oxide 60 is deposited over the composite layer 20, preferably by the decomposition of TEOS, to a thickness of about 150 Angstroms to about 250 Angstroms. The layer of oxide 60 functions as an etch stop material layer. As noted above, if the masking oxide layer 52 formed during the first oxidation step is thick enough, that is, greater than 150 Angstroms, the formation of the oxide layer 60 is not necessarily used. Under such circumstances the masking oxide layer 52 would itself entirely function as an etch stop material layer on the sidewall.

Figure 5:
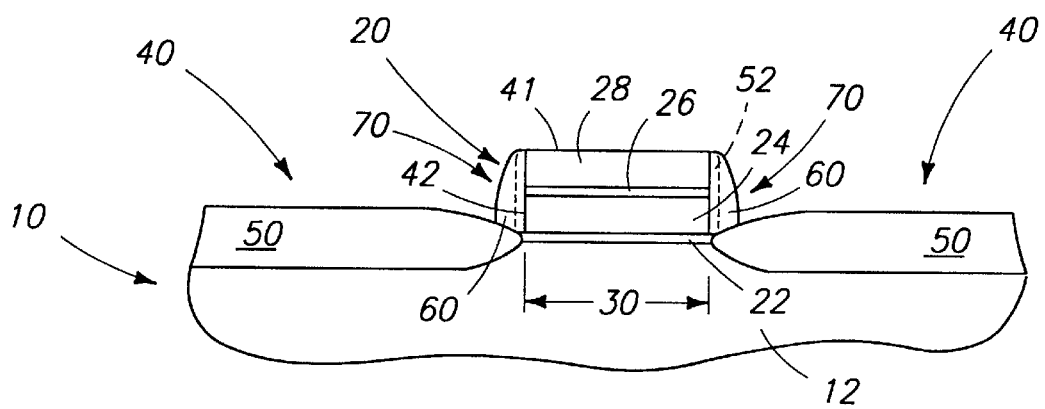
FIG. 5 is a view of the FIG. 1 wafer fragment at a processing step subsequent to that shown by FIG. 4.

Referring now to FIG. 5, the semiconductor wafer in process 12 is subjected to an anisotropic RIE etching technique which is effective to produce the sidewall spacers 70 which are disposed in covering relation relative to the sidewalls 42 of the composite layer 20. Where the masking oxide layer 52 is provided, the spacers would take the form of two layers of oxide 52, and 60 respectively. As noted, above, in the event that layer 52 is grown sufficiently thick, that is, greater than about 50 to about 150 Angstroms, then only one layer of oxide would typically be present. The etching technique effectively removes the oxide layers 52, and 60 and stops on surface 41 of the composite layer.

Figure 6:
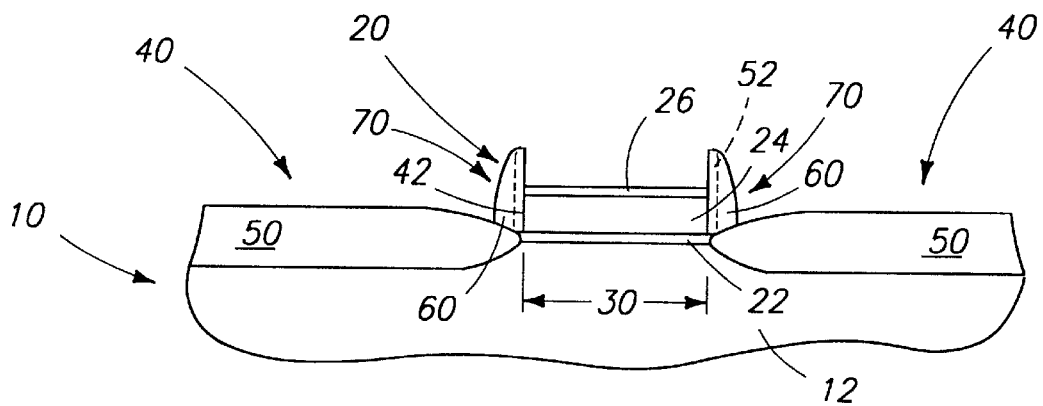
FIG. 6 is a view of the FIG. 1 wafer fragment at a processing step subsequent to that shown in FIG. 5.

Referring now to FIG. 6, following the exposure of the substrate 12 to oxidation conditions effective to form field isolation oxide 50, the method further comprises removing a portion of the third nitride layer 28. As will be seen by a study of FIG. 6, the sidewall spacers 70 suitably protect what would otherwise be exposed sidewalls 42 of the first silicon nitride layer 24. A removal technique for use with the third silicon nitride layer comprises an RIE oxidizing etch utilizing $CF_4$. An alternative chemistry comprises a hot phosphoric acid solution or bath.

After removing the third layer of silicon nitride 28, the method of the present invention further comprises removing the second layer 26, and the sidewall spacers 70. This can be achieved by the use of an aqueous (100:1) HF etching chemistry. The resulting wafer fragment is illustrated in FIG. 7 where the first silicon nitride layer 24 is exposed.

Referring now to FIG. 8 and after removing the second layer 26 and the sidewall spacers 70, the method further comprises a second oxidation of the substrate 12 to grow field isolation oxide 50 into a second thickness 50a on the unmasked, second portion or field regions 40 of the substrate 12. As will be seen from a study of FIG. 8, the first thickness of the field isolation oxide 50 is about 30% to about 60% of the resultant field oxide 50a. A thin layer of oxide 46 forms on the exposed silicon nitride layer as a result of this second oxidation.

Referring now to FIG. 9, following the second oxidation conditions, the first layer of nitride 24, and pad oxide 22 are stripped as shown.

The operation and method of fabrication of the present invention is believed to be readily apparent and is briefly summarized at this point.

In accordance with one aspect of the invention, a method of forming field oxide on a semiconductor substrate 10 to a desired thickness comprises:

conducting at least two separate oxidizing steps on the semiconductor substrate 10 to achieve said desired thickness.

Another aspect of the present invention relates to a semiconductor processing method of forming field isolation oxide 50/50a relative to a semiconductor substrate 10 comprising:

masking a first portion 30 of a semiconductor substrate 10 with masking material 20 comprising first 24, second 26, and third layers 28, and leaving a second substrate portion 40 of the semiconductor substrate unmasked by the masking material 20; and exposing the semiconductor substrate 10 to oxidizing conditions effective to form field isolation oxide of a given thickness on the second substrate portion 40.

In accordance with still another aspect of the invention, a semiconductor processing method of forming field isolation oxide relative to a silicon substrate 10 comprises:

forming masking material 20 on a semiconductor substrate 10 to define masked 30 and unmasked substrate areas 40;

subjecting the substrate 10 to first oxidation conditions effective to form field isolation oxide 50 of a first thickness on the unmasked area 40 of the substrate 10;

removing a portion of the masking material 20; and subjecting the substrate 10 to second oxidation conditions effective to form field isolation oxide 50a to a second thickness on the unmasked area 40 of the substrate 10.

Yet still a further aspect of the present invention relates to a semiconductor processing method of forming field isolation oxide relative to a semiconductor substrate 10 comprising:

providing a semiconductor substrate 10 having field and active area regions 40 and 30;

forming masking material 20 over the active area region 30, and leaving the field region 40 exposed, the masking material 20 comprising first 24, second 26, and third layers 28, and having a sidewall 42;

subjecting the semiconductor substrate 10 to first oxidation conditions effective to form field isolation oxide 50 of a first thickness over the exposed field regions 40;

forming an etch stop material layer 60 over the sidewall 42;

removing at least a portion of the third layer 28 selectively relative to the etch stop material layer 60; and subjecting the semiconductor substrate 10 to second oxidation conditions effective to grow the field isolation oxide to a second thickness 50a on the exposed field region 40 of the semiconductor substrate 10.

Another aspect of the present invention relates to a semiconductor processing method of forming field isolation oxide relative to a semiconductor substrate 10 comprising:

forming a first layer of silicon nitride 24 over the semiconductor substrate 10;

forming a second layer of oxide 26 over the first layer 24;

forming a third layer of silicon nitride 28 over the second layer of oxide 26;

patterning and removing a portion of the first, second, and third layers 24, 26, and 28, to define an active area region 30 of the semiconductor substrate 10 beneath the remaining first, second and third layers of material 24, 26, and 28, and leaving a second portion 40 of the semiconductor substrate 10 unmasked by the first, second, and third layers 24, 26, and 28, patterned first, second and third layers collectively having exposed surfaces 41 and sidewalls 42;

first oxidizing the patterned first, second, and third layers 24, 26, and 28, and the substrate 10 to form field isolation oxide 50 to a first thickness on the unmasked second portion 40 of the semiconductor substrate 10, and form a layer of masking oxide 50 on the exposed surfaces 41 and sidewalls 42 of the first, second and third layers 24, 26 and 28;

after the first oxidizing step, removing the third layer of silicon nitride 28;

after removing the third layer of silicon nitride 28, removing the second layer of oxide 26 and the masking oxide 52 covering the sidewalls 42 of the first, second and third layers, and exposing the first layer 24; and after removing the second layer of oxide 26, second oxidizing the semiconductor substrate 10 to grow the field isolation oxide to a second thickness 50a over the semiconductor substrate 10.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming field oxide relative to a substrate, comprising:

first forming a field oxidation mask having a predetermined width and height dimension over the semiconductor substrate, and wherein the field oxidation mask comprises a first layer of Silicon Nitride, a second layer of oxide positioned over the first Silicon Nitride layer, and a third layer of Silicon Nitride positioned over the second layer of oxide, and wherein the field oxidation mask has exposed sidewalls, and wherein the field oxidation mask overlies an active area region of the semiconductor substrate, and wherein the semiconductor substrate defines field regions which are adjacent the active area region;

after forming the field oxidation mask, first oxidizing the semiconductor substrate to form field oxide in the field regions of a first thickness, and wherein the second layer of oxide is positioned elevationally above the field oxide formed during the first oxidizing;

after forming the field oxide having the first thickness, providing sidewall spacers in covering relation relative to the sidewalls of the field oxidation mask;

after forming the sidewall spacers, removing the third layer of Silicon Nitride;

after removing the third layer of Silicon Nitride, removing the second layer of oxide and the sidewall spacers to expose the first Silicon Nitride layer and the sidewalls thereof;

after removing the second layer of oxide and the sidewall spacers, second oxidizing the semiconductor substrate to increase the thickness of the field oxide to a second thickness, and wherein the second oxidizing does not substantially distort the first Silicon Nitride layer; and after the second oxidizing, removing the first Silicon Nitride layer to expose the active area therebeneath.

* * * * *